United States Patent [19]

Naka et al.

[11] Patent Number: 5,239,412
[45] Date of Patent: Aug. 24, 1993

[54] SOLID IMAGE PICKUP DEVICE HAVING MICROLENSES

[75] Inventors: Shun-ichi Naka, Habikino; Kiyotoshi Misawa, Souraku; Jun-ichi Nakai, Fukuyama, all of Japan

[73] Assignee: Sharp Kabushiki Kaisha, Osaka, Japan

[21] Appl. No.: 650,238

[22] Filed: Feb. 4, 1991

[30] Foreign Application Priority Data

Feb. 5, 1990 [JP] Japan .................................. 2-25788
Mar. 29, 1990 [JP] Japan .................................. 2-82064
Jun. 7, 1990 [JP] Japan .................................. 2-149630

[51] Int. Cl.⁵ .................................. H01L 31/0232
[52] U.S. Cl. .................................. 359/619; 359/620; 359/621; 359/622
[58] Field of Search ............... 359/619, 620, 621, 622, 359/623, 741, 642, 900

[56] References Cited

U.S. PATENT DOCUMENTS

| | | | |
|---|---|---|---|
| 1,943,995 | 1/1934 | Weld | 359/619 X |
| 3,018,313 | 1/1962 | Gattone | 359/622 X |
| 3,383,676 | 5/1968 | Nagel | 359/620 X |
| 3,984,583 | 10/1976 | Hermans et al. | 427/43 |
| 4,129,628 | 12/1978 | Tamutus | 359/620 X |
| 4,667,092 | 5/1987 | Ishihara | 359/619 X |
| 4,695,719 | 9/1987 | Wilwerding | 359/619 X |
| 4,807,978 | 2/1989 | Grinberg et al. | 359/619 X |
| 5,104,435 | 4/1992 | Oikawa et al. | 359/619 X |

FOREIGN PATENT DOCUMENTS

| | | |
|---|---|---|
| 59-90466 | 5/1984 | Japan . |
| 60-29703 | 2/1985 | Japan . |
| 60-60756 | 4/1985 | Japan . |
| 60-175001 | 9/1985 | Japan . |
| 60-59752 | 12/1985 | Japan . |
| 61-134061 | 6/1986 | Japan . |
| 2-162318 | 6/1990 | Japan .................................. 359/619 |

OTHER PUBLICATIONS

"On-Chip Color Filter for CCD Imagers," National Technical Report, vol. 36, No. 3, Jun., 1990.
Nikkei Microdevices, pp. 87-94, Jun., 1990.

Primary Examiner—Constantine Hannaher
Assistant Examiner—Edward J. Glick

[57] ABSTRACT

In a solid image pickup device, a plurality of microlenses are provided on a substrate having light receiving portions in opposition to the light receiving portions so that incident light can converge onto the light receiving portions. The microlenses are covered with a transparent resin layer having a refractive index smaller than that of the microlenses. Therefore, the solid image pickup device, even when packaged in a molded body made of a resin having a refractive index similar to that of the microlenses, can realize good sensitivity because the microlenses can effectively operate as condenser lenses due to the resin layer between the molded body and the microlenses.

14 Claims, 6 Drawing Sheets

SOLID IMAGE PICKUP DEVICE HAVING MICROLENSES

BACKGROUND OF THE INVENTION

The present invention relates to a solid image pickup device such as a CCD (charge-coupled device) camera, for example, wherein microlenses are formed as condenser lenses on the upper surface of light receiving portions of the substrate.

As the chip size of solid image pickup devices decreases and the number of pixels per a device increases, the area of each light receiving portion on the substrate has been reduced. As a result, an amount of light received by each light receiving portion decreases and therefore sensitivity (output/(amount of incident light)) of the device lowers.

In order to solve the above problem, a solid image pickup device has been proposed, which is shown in FIG. 1 and is generally indicated by a reference numeral 60. As shown in FIG. 1, microlenses 28 made of a transparent polymeric resin are formed on the upper surface of each of light receiving portions (not shown) which are pixels.

The microlenses 28 serve as condenser lenses for incident light, that is, incident light is converged to the light receiving portions by the microlenses 28. Therefore, effective light received by each light receiving portion increases and the sensitivity deterioration is prevented.

Generally, the solid image pickup device 60 has been contained in a ceramic package 76 as shown in FIG. 2. In FIG. 2, a reference numeral 70 indicates a ceramic substrate mounting the solid image pickup device 60, a reference numeral 74 indicates a lead pin and a reference numeral 78 indicates a glass lid for the ceramic package 76.

Recently, a molded package 72 using a transparent resin, as shown in FIG. 3, is replacing the ceramic package 76 for the reason that the production cost can be lower. In this case, the following problem occurs.

The microlenses 28 are formed of polystyrene, acrylic resin, novolak resin or other transparent resins. On the other hand, epoxy resin is used as a molding resin. The above transparent resins of the microlenses 28 have a refractive index of 1.5–1.6 and the molding epoxy resin also has a refractive index of 1.5–1.6. Therefore, when the solid image pickup device 60 is packaged by the molding resin, the condenser effect or light converging effect of the microlenses 28 is largely reduced or canceled by the molding resin.

SUMMARY OF THE INVENTION

An object of the present invention is therefore to provide a solid image pickup device wherein microlenses can effectively serve as condensers even if the image pickup device is packaged by a molding resin.

In order to accomplish the above object, in a solid image pickup device wherein a plurality of microlenses are provided on a substrate having light receiving portions, opposite the light receiving portions so that incident light can converge onto the light receiving portions, the microlenses are covered with a transparent resin layer having a refractive index smaller than that of the microlenses.

Transparent polymeric resins having different refractive indices from each other are used as materials of the microlenses and the layer covering the microlenses, respectively. More specifically, the transparent polymeric resin for the microlenses may be a polyimide resin, polyether amide resin, polystyrene resin or other resins which have a refractive index of 1.6–1.8. The transparent polymeric resin for the resin layer covering the microlenses may be an epoxy resin, acrylic resin or other resins which have a refractive index of 1.3–1.5.

When the solid image pickup device is packaged in a molded body made of a transparent molding resin having a refractive index similar to that of the microlenses, because the resin layer having a refractive index smaller than that of the microlenses covers the microlenses, reduction or cancellation of the light converging effect of the microlenses by the molding resin is avoided.

In addition, because the solid image pickup device of the present invention is not subjected to cancellation of the light converging effect of the microlenses by the molding resin and therefore can use a molded package, the production cost can be lowered.

Furthermore, in order to accomplish the above object, according to a solid image pickup device of another embodiment of the present invention, the microlenses have a refractive index larger than that of a transparent molding resin for packaging the device. In this case, it is not necessary to provide a transparent resin layer having a refractive index smaller than that of the microlenses over the microlenses, unlike the first embodiment.

In order to increase the refractive index of the microlenses, the microlenses are increased in optical density by any one or more of the following three methods.

(1) Addition of a metal oxide to a base material.

(2) Introduction of an aromatic ring into a base material.

(3) Introduction of a halogenated alkyl group into a base material.

Thus, even when the solid image pickup device is packaged in a molded body, incident light can be converged onto light receiving portions by means of the difference in refractive index between the microlenses and the molding resin. As a result, sensitivity of the solid image pickup device is improved.

Another object of the present invention is to provide a method for forming microlenses having a high refractive index and a high permeability to light without changing properties of color filters.

In order to accomplish the above object, a method according to the present invention has the following steps:

(a) forming a layer of a photosensitive resin which has permeability to light and a refractive index of 1.65 or more on a substrate which has a plurality of light receiving portions arrayed in one or more rows;

(b) selectively photo-etching the photosensitive resin layer in a square or stripe pattern to leave the photosensitive resin layer in a sectionally rectangular shape on the substrate in positions corresponding to respective ones of the light receiving portions or positions corresponding to respective rows of the light receiving portions; and (c) applying a heat treatment to the substrate provided with the photosensitive resin layer at a temperature not affecting properties of the color filters, with ultraviolet rays being irradiated onto the photosensitive resin layer during said heat treatment so that photo active groups contained in the photosensitive resin are decomposed and that the photosensitive resin is softened at said temperature to be shaped semi-spherical or semi-cylindrical by surface tension of the photosensitive resin.

Preferably, the heat treatment is performed at a temperature below 160° C.

When the photosensitive resin on the substrate is exposed to ultraviolet rays, photo-degradation or photodepolymerization occurs to photo active groups contained in the photosensitive resin. And, a polymer of the photosensitive resin lowers in molecular weight, so the glass transition point lowers. As a result, the photosensitive resin, which will not be fused at a temperature below 180° C. with only a heat treatment, can be fused at a temperature as low as 140°–150° C. Therefore, the color filters are not affected by the heat during the microlenses are formed. In addition, the irradiation of the ultraviolet light decompose the photo active groups in the photosensitive resin which absorb visible light, so that absorption of visible light is decreased after the completion of the microlenses. Accordingly, even though the photosensitive resin has a comparatively low permeability to light before treated with ultraviolet light, the permeability to light is increased through the irradiation of ultraviolet light. Thus, microlenses with a good permeability to light are obtained.

BRIEF DESCRIPTION OF THE DRAWINGS

The present invention will become more fully understood from the detailed description given below and the accompanying drawings which are given by way of illustration only, and thus are not limitative of the present invention, and wherein.

DETAILED DESCRIPTION OF THE PREFERRED EMBODIMENTS

Figure 1:
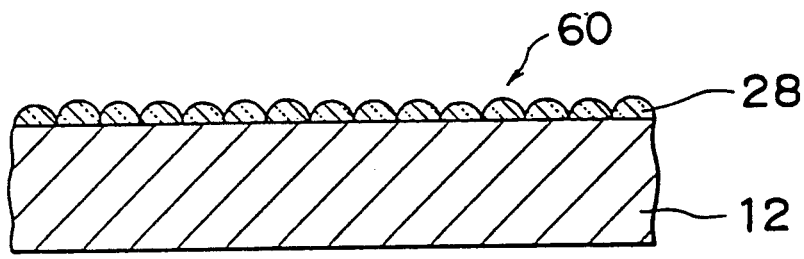
FIG. 1 shows a sectional view of a conventional solid image pickup device.
Figure 2:
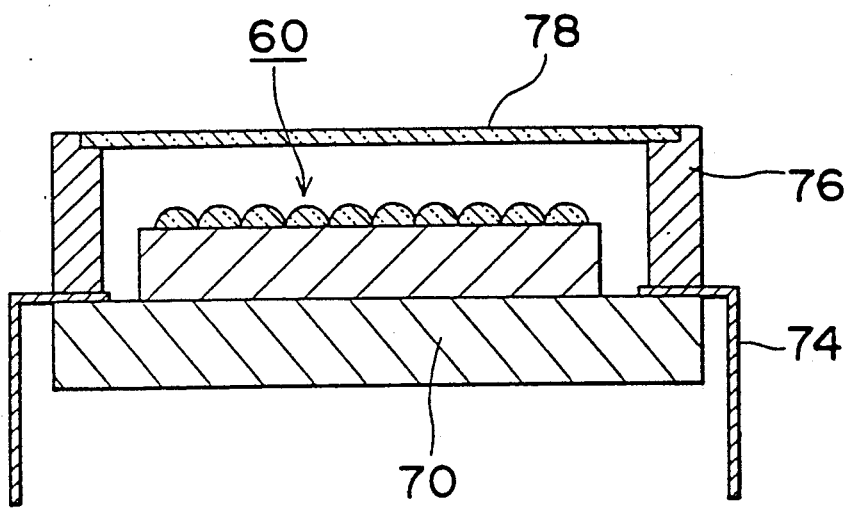
FIG. 2 shows a sectional view of the conventional solid image pickup device in a state contained in a ceramic package.

Before the description of the present invention proceeds, it is to be noted that like parts are designated by like reference numerals throughout the accompanying drawings.

Figure 4:
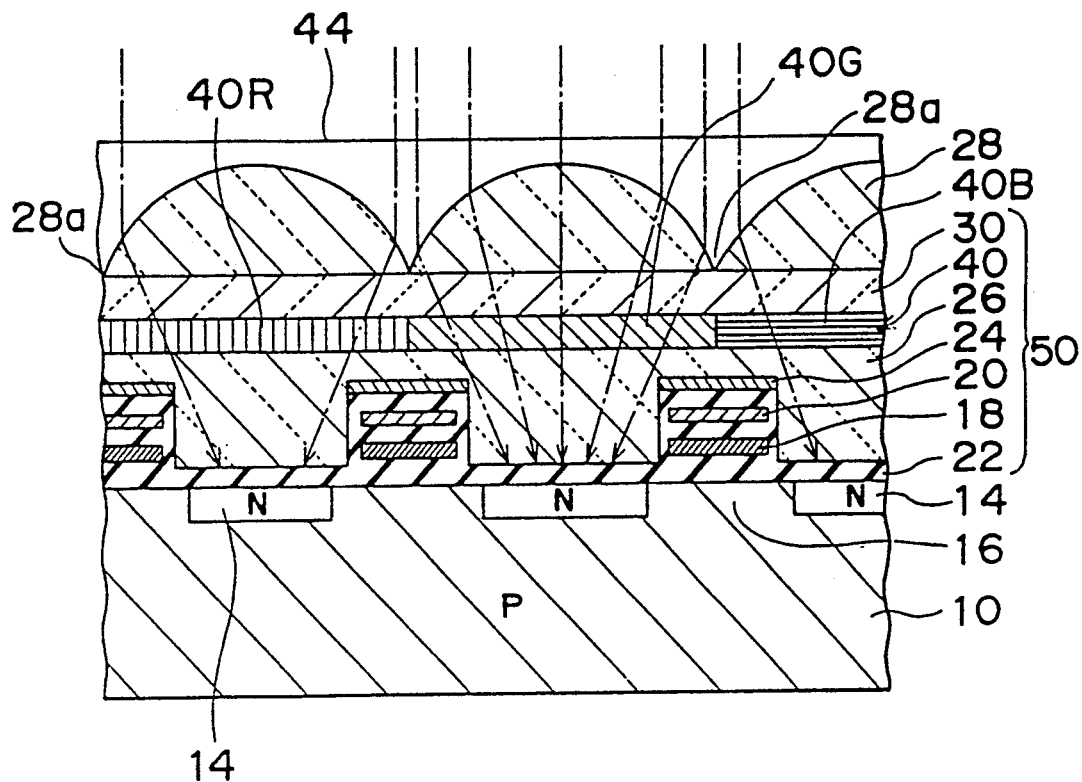
FIG. 4 shows a sectional view of a solid image pickup device using a CCD according to a first embodiment of the present invention.

FIG. 4 shows a solid image pickup device using a CCD as an example of a solid image pickup device of the present invention. The present invention can be applied to a solid image pickup device of either a one-dimensional structure or a two-dimensional structure.

Figure 5:
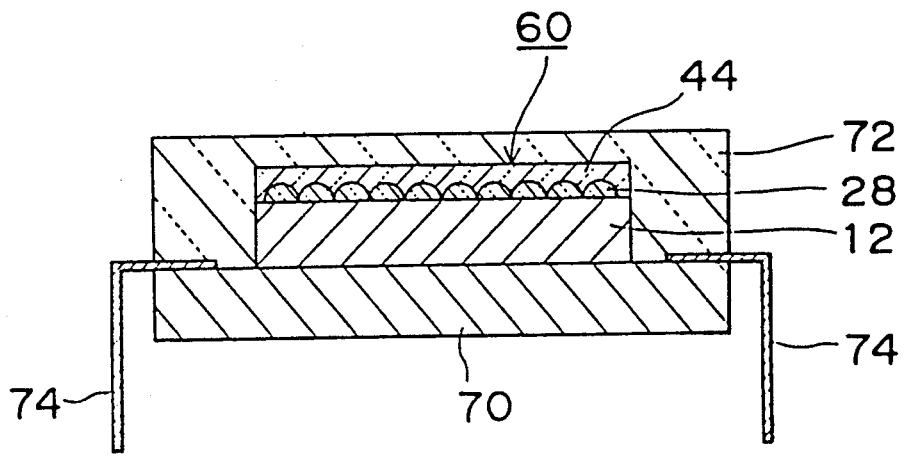
FIG. 5 shows a sectional view of the solid image pickup device in a state packaged in a molding resin.

The solid image pickup device is generally indicated by a reference numeral 60 in FIG. 5. A semiconductor substrate 10 is of a P type and light receiving portions 14 in the substrate 10 are of an N type. Double-layered transfer electrodes 18, 20 are provided on the semiconductor substrate 10 through an insulation layer 22 at charge transfer portions 16 which are sandwiched between the light receiving portions 14 and 14.

A light screening metal 24 is provided over the double-layered transfer electrodes 18, 20 so that light does not enter the charge transfer portions 16.

A flattening layer 26 made of an acrylic resin is provided over the light screening metals 24 and the light receiving portions 14 so that recesses formed between projections of the double-layered transfer electrodes 18, 20 are filled and that a flat surface is formed all over the semiconductor substrate 10.

On the flattening layer 26 are provided red, green and blue color filters 40R, 40G, 40B (generally designated 40) in order to obtain a colored image. The color filters 40 are formed opposite the light receiving portions 14 so that only monochromatic light of red, green and blue comes to the respective light receiving portions 14. The color filters 40 may be formed by dyeing gelatin, case in or other materials.

Furthermore, a protection layer 30 is provided on the color filters 40. The protection layer 30 not only protects the color filters 40 but also mounts microlenses 28 thereon. The microlenses 28 are formed in positions opposite to the light receiving portions 14.

The protection layer 30 is treated to be hardened prior to the formation of the microlenses 28. More specifically, when the protection layer 30 is made of an ultraviolet-curing resist or a far-ultraviolet-curing resist, ultraviolet or far ultraviolet radiations are irradiated. On the other hand, when the protection layer 30 is made of a thermosetting resin, a heat treatment is applied to the protection layer 30.

The above hardening treatment prevents the protection layer 30 from suffering from heat distortion even if heat is applied while the microlenses 28 are formed. Therefore, the microlenses are well formed in a good shape. The protection layer 30 works as a flattening layer as well.

The microlenses 28 may be formed individually in positions corresponding to the respective light receiving portion 14. In addition, the microlenses 28 may be formed collectively in columns or rows in positions corresponding to each column or row of light receiving portions 14.

The microlenses 28 are formed in a manner that peripheries 28a of the microlenses 28 are continuous to each other. By making the peripheries 28a of the microlenses 28 continuous to each other, incident light to the peripheries 28a can be lead to the light receiving portions 14. Therefore, almost all the light coming to the microlenses 28 reaches the light receiving portions 14. As a result, a total amount of incident light increases and the sensitivity increases correspondingly.

Photosensitive resins, which are sensitive to ultraviolet or far ultraviolet radiations, or polymeric resins permeable to light are used as microlens materials. Of such resins, especially those that have a refractive index of 1.6–1.8 are used. Such a resin may be a polyimide resin, polyether amide resin, or polystyrene resin. If a photosensitive resin is used as microlens material, a resist layer (described later) will be used. If a photosensitive resin is not used, a pattern for microlenses is formed using a photo-etching and a dry-etching technique.

Photosensitive resins are subjected to heat distortion during a heat treatment after the photosensitive resins are irradiated by ultraviolet rays or far ultraviolet rays. Therefore, an initial planar shape of a microlens resin layer on the protection layer 30 is changed to a semi-spherical shape or to a semi-cylindrical shape by the heat treatment. Before the shape is changed, the resin of the microlenses are treated with ultraviolet or far ultraviolet radiations, so that the resin is increased in permeability to light.

A resin layer 44 of a given thickness is formed over the microlenses 28. This resin layer 44 is positioned between the microlenses 28 and a molding resin when the solid image pickup device is packaged in the molding resin, so that the resin layer 44 is referred to as an intermediate resin layer hereinbelow. A resin which has a refractive index of 1.3–1.5, such as, for example, an epoxy resin, an acrylic resin or a perfluoro resin, are used for the intermediate resin layer 44.

The solid image pickup device 60 with the above structure, specifically with the intermediate resin layer 44 of a refractive index smaller than that of the microlenses 28 being formed on the microlenses 28, is molded with or packed in a molded body 72, as shown in FIG. 5. In FIG. 5, a reference numeral 70 indicates a resin substrate for mounting the color solid image pickup device 60. There are provided lead pins 74 at both ends of the resin substrate 70.

A molded body 72 is formed of a transparent resin which covers not only the solid image pickup device 60 but also the upper surface of the resin substrate 70. Epoxy resin, for example, is used as a molding resin, as described above.

The following describes a fabrication method of the microlenses 28 and a package method of the solid image pickup device using a resin molding technique, referring to FIGS. 6A–6E. In the following description, it is assumed that the microlenses 28 are individually formed in the positions corresponding to the respective light receiving portion 14.

Figure 6A:
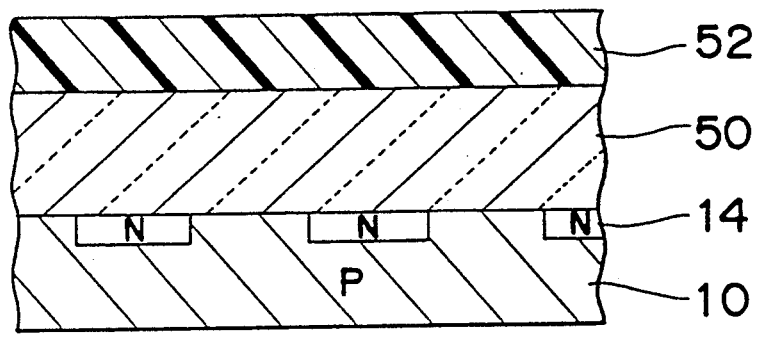
FIGS. 6A–6E show production steps of the solid image pickup device of FIG. 5.

First, as shown in FIG. 6A, doping of N-type impurities to the P-type semiconductor substrate 10 at given places is done to form the light receiving portions 14. After that, the double-layered transfer electrodes 18, 20, the light screening metal 24, the flattening layer 26 are sequentially formed on the semiconductor substrate 10 in a known manner, though they are not individually shown in FIGS. 6A–6E.

The flattening layer 26 may be formed of an acrylic resin, polyimide resin, isocyanate resin, or urethane resin, for example. In this embodiment, an acrylic resin named FVR-10 (Manufactured by Fuji Yakuhin Kabushiki Kaisha) is used. The flattening layer 26 is formed by spin-coating the acrylic resin in the thickness of 5.0 μm, for example. Then, the color filters 40R, 40G, 40B are formed on the flattening layer 26. Thereafter the color filters 40R, 40G, 40 B are coated with the protection layer 30. A hardening treatment is applied to the color filters 40 and the flattening layer 30. These layers provided between the semiconductor substrate 10 are shown collectively as a fixed layer 50 in FIG. 6A.

A resist layer 52 which is sensitive to ultraviolet or far ultraviolet rays is spin-coated in the thickness of, for example, 3.0 μm on the fixed layer 50. In the present embodiment, a positive resist layer 52 is formed.

For example, a novolak resin such as AZ, OFPR or Micro Posit (product names) can be used for the positive resist layer 52. If no positive resists are used, a pattern is formed by a photo-etching and a dry-etching. Because novolak resins can be minutely processed, the light receiving portions can be formed in a high density.

Figure 6B:
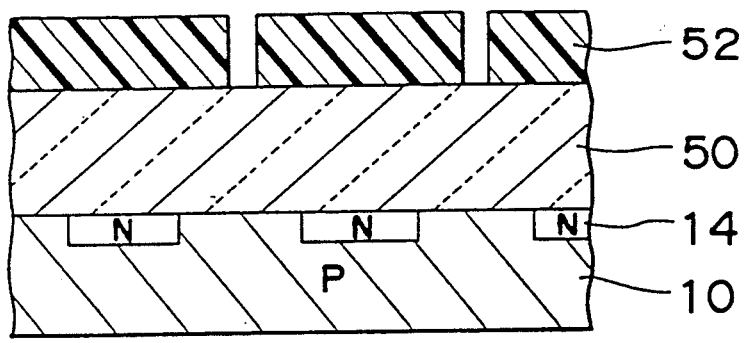

After the positive resist layer 52 on the fixed layer 50 is dried, portions of the positive resist layer 52 other than portions corresponding to the light receiving portions 14 are exposed to ultraviolet rays and then developed to have a predetermined pattern. In this way the patterning is completed as shown in FIG. 6B.

Figure 6C:
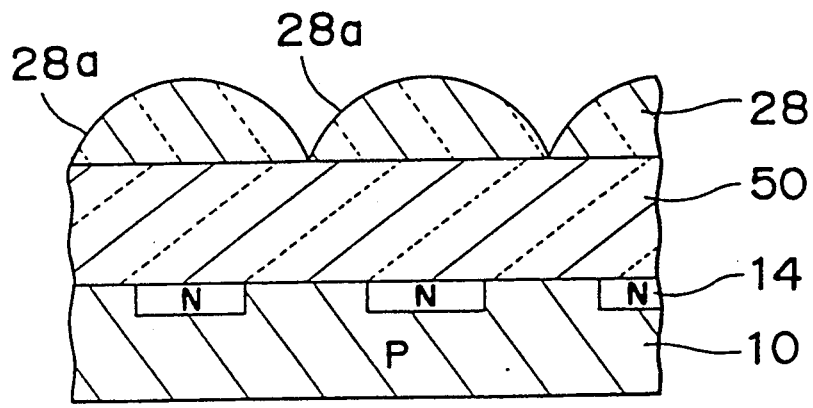

Next, the positive resist layer 52 in the predetermined pattern is treated with heat at a temperature below 160° C., desirably at a temperature between 130°–150° C. so that the positive resist layer 52 is semi-spherically deformed as shown in FIG. 6C. Finally, the microlenses 28 with their respective peripheries 28 connected to each other are obtained.

The heating temperature is set below 160° C. in consideration of the heat resistance property of the color filters 40R, 40G, 40B which are part of the fixed layer 50, so that the color filters are not subjected to thermal change in properties.

Before the completion of the microlenses 28 through the thermal deformation of the positive resist layer 52, ultraviolet rays of 350–450 nm are irradiated. The positive resist layer 52 which has been opaque till then becomes transparent through the exposure to the ultraviolet rays. In addition, the irradiation of ultraviolet or far ultraviolet rays after the completion of the microlenses 28 causes the microlenses 28 to be cured or hardened. The microlenses 28 are therefore thermally stable.

The positive resist layer 52 is processed to be hardened after thermally deformed, considering the two properties of the positive resist layer 52 that the positive resist layer 52 is made transparent by the exposure to ultraviolet or far ultraviolet rays and that once exposed to ultraviolet or far ultraviolet rays, the positive resist layer 52 becomes thermally very stable although the positive resist not treated with ultraviolet or far ultraviolet rays is easily softened with heat of 120°–160° C. It is to be noted, however, that the heat treatment may be applied simultaneously with the irradiation of far ultraviolet or ultraviolet rays.

Figure 6D:
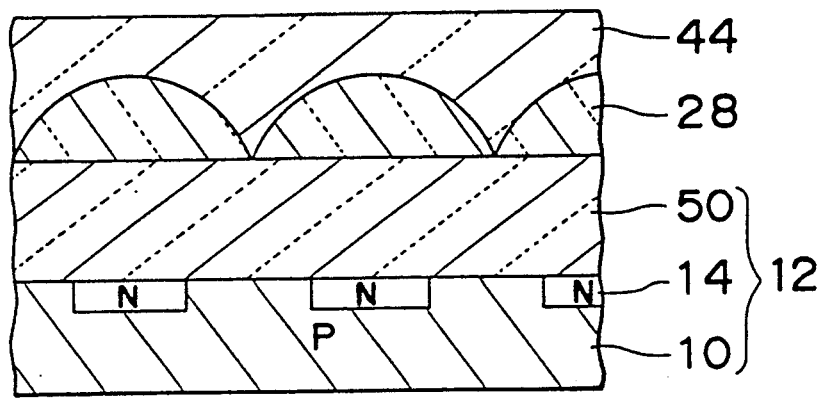

Next, as shown in FIG. 6D, the microlenses 28 are coated with the intermediate resin layer 44 of a predetermined thickness. As described above, the intermediate resin layer 44 can be treated with heat after coated on the microlenses 28.

Figure 6E:
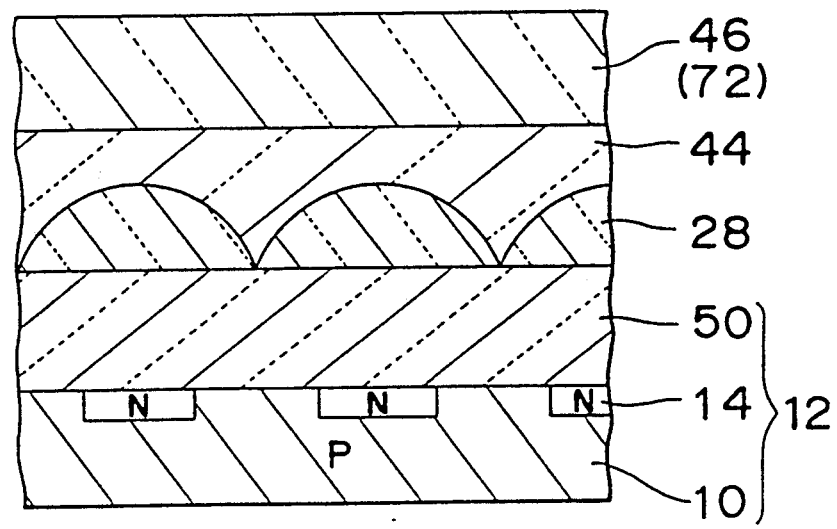

Next, the molded body 72, as shown in FIG. 5, for packaging the color image pickup device 60 is formed of a transparent resin layer 46, as shown in FIG. 6E.

Figure 7:
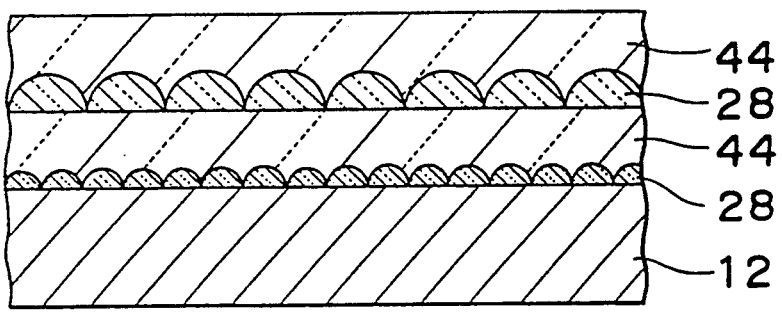
FIG. 7 shows a sectional view of a modification of the solid image pickup device of FIG. 4.

FIG. 7 shows a modification wherein the microlenses 28 and intermediate resin layers 44 are provided in a double-layer structure on the solid image pickup device substrate 12 including the semiconductor substrate 10, the light receiving portions 14 and the fixed layer 50. It is to be noted that in this case the microlenses 28 of an upper layer are larger in size than the microlenses 28 of a lower layer. According to this structure, more light can be gathered.

In the above embodiment, the present invention is applied to a color solid image pickup device using a CCD. However, the present invention is also applied to other types of solid image pickup devices for not only imaging color images but black and white images as well.

Second Embodiment

Figure 8:
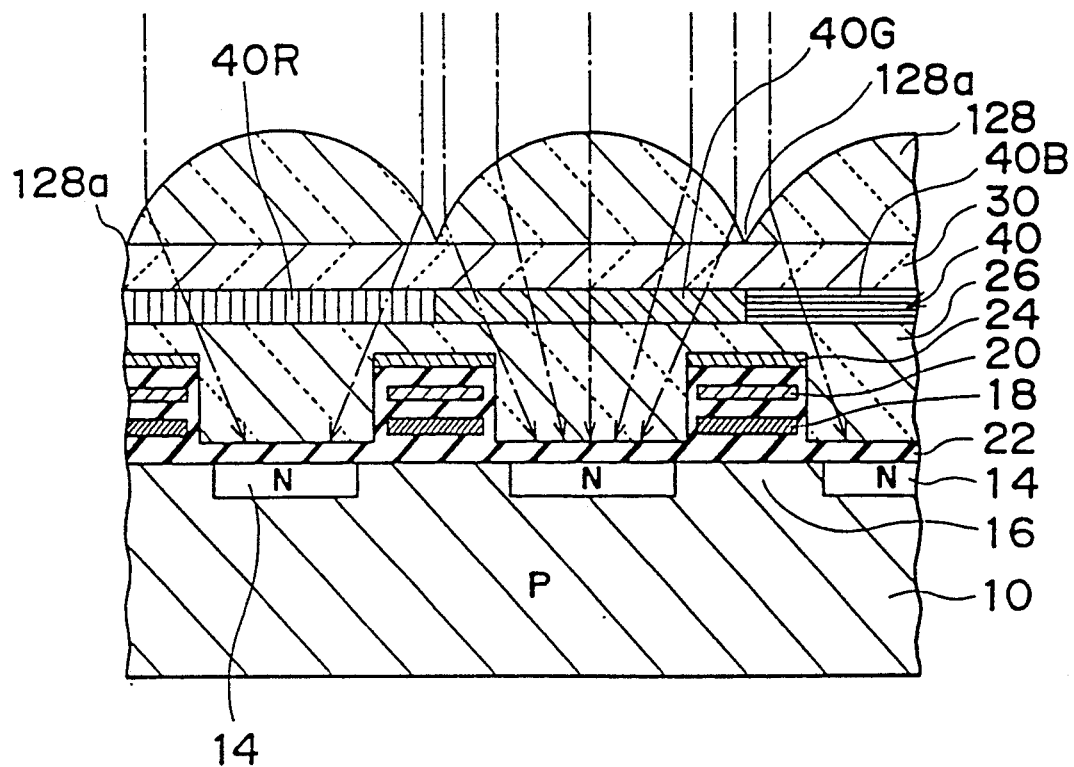
FIG. 8 shows a sectional view of a solid image pickup device according to another embodiment of the present invention.

FIG. 8 shows a cross sectional view of a solid image pickup device using a CCD as a second embodiment of the present invention. In FIG. 8, the reference numerals same as those of FIG. 4 showing the first embodiment indicate similar parts and therefore a description on those parts is omitted. A reference numeral 128 indicates a microlens which has a high optical density and therefore has an increased refractive index. Peripheries 128a of the microlenses 128 are continuous to each other. Polymeric resin such as, for example, polystyrene, acrylic resin, novolak resin, polyethylene, or ethyl methacrylate is used as microlens material. The optical density of the microlenses 128 is increased in any one or more of the following methods.

(1) Addition of a metallic oxide such as titanium oxide, indium oxide, tin oxide, aluminum oxide, for example, to a polymeric resin as microlens material as recited above.

(2) Introduction of an aromatic ring such as, for example, a benzene ring, a naphthalene ring.

By the introduction of an aromatic ring into a base polymeric resin, a polymeric resin such as, for example, polydiphenylmethyl methacrylate, polyvinylnaphthalene is obtained.

(3) Introduction of a halogenated alkyl group at a high rate.

By this introduction, a polymeric resin such as, for example, poly-p-chloromethylstyrene is obtained.

The microlenses 28 made of a material obtained by any one or more of the above methods improve in optical density. As a result, the refractive index of the microlenses 128 increases to 1.7–1.8, when compared with that (1.5–1.6) of the microlenses made of only a base resin.

Figure 3:
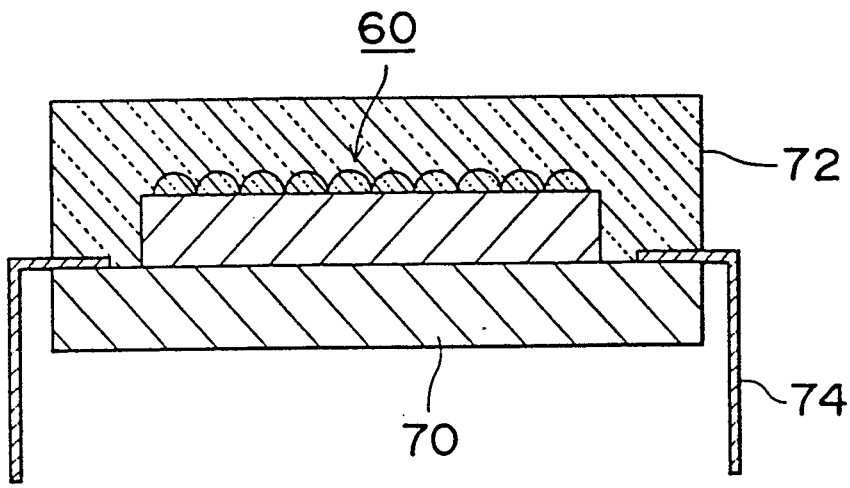
FIG. 3 shows a sectional view of the conventional solid image pickup device in a state packaged in a molding resin.

When the solid image pickup device having the microlenses 128 of such an increased refractive index is packaged in a molded body (see FIG. 3) formed of a transparent resin having a refractive index of 1.5–1.6, there is a difference in refractive index between the microlenses 128 and the molded body 72. As a result, light-converging effect of the microlenses 128 is not canceled or reduced by the molded body 72. Accordingly, the solid image pickup device of the present embodiment can have a good sensitivity. In addition, because the solid image pickup device can thus use a molding package, it can be produced at a low cost.

Third Embodiment

Figure 9:
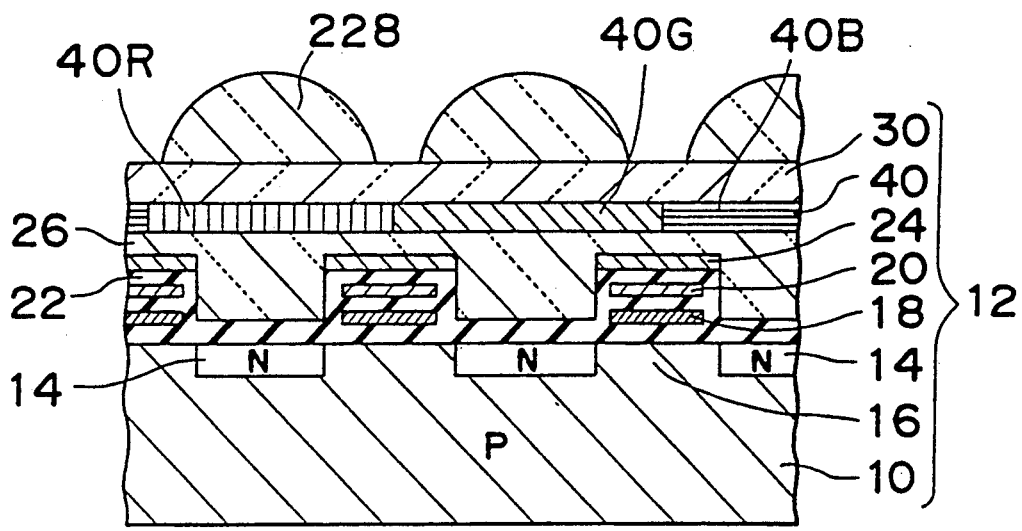
FIG. 9 shows a sectional view of a solid image pickup device provided with microlenses which are formed by a method of the present invention.

FIG. 9 shows a cross sectional view of a solid image pickup device with microlenses formed by a method according to the present invention. In FIG. 9, the reference numerals same as those of FIG. 4 showing the first embodiment indicate similar parts and therefore a description on those parts is omitted. A reference numeral 228 indicates a microlens formed by a method according to this embodiment. The microlenses 228 are made in the following method. It is to be noted that in the following description, the parts individually designated 12, 14, 16, 18, 20, 22, 24, 26, 40 (40R, 40G, 40B), and 30 in FIG. 9 are collectively indicated by the reference numeral 12 as a solid image pickup device substrate.

Figure 10A:
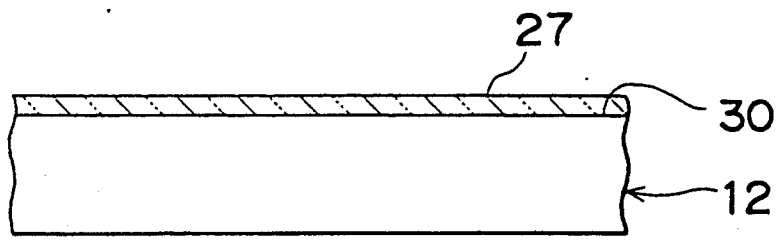
FIGS. 10A–10C show steps for producing the solid image pickup device of FIG. 9.
Figure 10B:
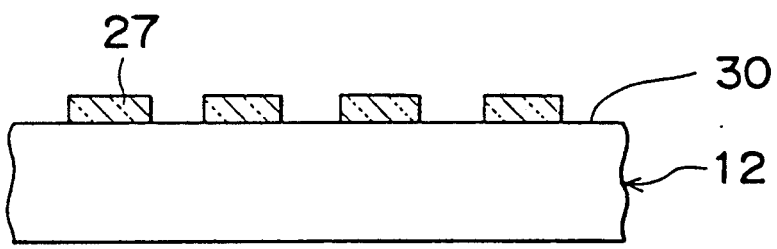

FIGS. 10A–10B are illustrations showing steps of forming the microlenses 28.

First, the solid image pickup device substrate 12 provided with the color filters made of gelatin or case in are prepared. The color filters 40 are provided in a manner covering the light receiving portions 14. Then, as shown in FIG. 10A, a photosensitive resin layer 27 is coated in the thickness of 2 μm on the upper surface of the solid image pickup device substrate 12 or more specifically of the protection layer 30.

Next, the photosensitive resin layer 27 is selectively etched in a square pattern or in stripes using a photo-etching method, so that the photosensitive resin layer 27 is left in a sectionally rectangular shape on the substrate 12, as shown in FIG. 10B. When the photosensitive resin layer 27 is etched in a square pattern, squares of the photosensitive resin layer 27 are formed for each light receiving portion 14. On the other hand, when a stripe pattern is used, stripes of the photosensitive resin layer 27 are formed for each row or column of light receiving portions 14. The photosensitive resin 27 is a polystyrene derivative such as a copolymerizate of poly-p-vinylphenol and poly-p-vinylchlorobenzene, for example, with naphtoquinonediazido-5-sulfonyl chloride as a sensitizing agent. The refractive index of the photosensitive resin 27 is in the order of 1.70. The transmittance of the photosensitive resin layer 27 after photo-etched is 45% (reddish brown) under the measuring conditions of a wavelength 400 nm and a film thickness 2 μm. This value is lower than that (about 80%) of a novolak resin with naphtoquinone diazide. It is necessary to heat at a temperature above 180° C. to soften the photosensitive resin 27.

Figure 10C:
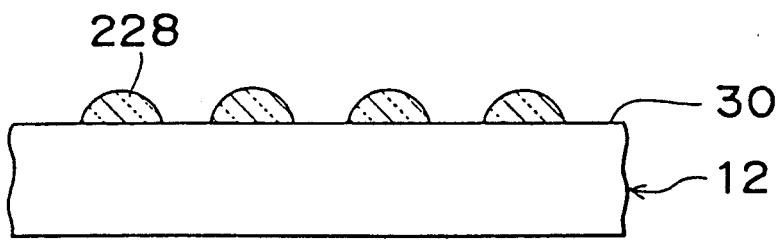

Next, near ultraviolet light (350–450 nm) including a light component of a wavelength 365 nm is irradiated from a high-pressure mercury vapor lamp onto the photosensitive resin layer 27. Under this condition, the substrate 12 with the photosensitive resin layer 27 is heated in an oven at a temperature of 150° C. for half an hour. The irradiation condition is 8 mW/cm$^2$, and 320 mJ/cm$^2$ for the wavelength of 365 nm. During this process, photodegradation or photo-depolymerization occurs to light active groups contained in the photosensitive resin 27 due to the near ultraviolet light. And a polymer of the photosensitive resin 27 lowers in molecular weight so that the glass transition point lowers. Consequently, the polymer, which, if only simply heated without irradiation of the near ultraviolet light, will be fused at a temperature above 180° C., are fused at a temperature as low as 150° C. The photosensitive resin 27 is then semispherically or semi-cylindrically shaped, as shown in FIG. 10C, by means of its own surface tension. At this time, because the heating temperature is as low as 150° C., properties of the color filters 40 are not changed. In this manner, microlenses 228 with an increased refractive index (1.65–1.70) are obtained without affecting properties of the microlenses 228.

According to the above method, the irradiation of near ultraviolet light can decompose the light active group in naphtoquinone-diazido-5-sulfonyl chloride of the sensitizing agent, so that absorption of visible light can be reduced after the completion of the microlens production process. Actually, the transmittance could be increased to more than 92%, and therefore, microlenses 228 having a better transparency or permeability to light than before were obtained.

The photosensitive resin layer 27 may be also formed of polyimide (refractive index: 1.70) or polyethylene terephthalate (refractive index: 1.68), for example, instead of the aforementioned material. When these materials are used, the transmittance will be 80-90%. It is to be noted that when polyethylene terephthalate is used, it is necessary to provide a photo resist before photo etching with an appropriate etchant because this material cannot be photo-etched directly.

As described above, according to the third embodiment, because a photosensitive resin which is a microlens material is exposed to ultraviolet light during the heat treatment, the heating temperature can be below 160° C. Therefore, on-chip color filters are not subjected to change in properties, and good-quality microlenses having an increased refractive index and transparency can be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid image pickup device comprising:
   a substrate having light receiving portions;
   a plurality of first spherical microlenses provided on said substrate having said light receiving portions, said plurality of first spherical microlenses forming a single layer such that each light receiving portion of said substrate is positioned under one of said plurality of first spherical microlenses, said microlenses being opposite said light receiving portions so that incident light can converge onto said light receiving portions; and
   a first transparent resin layer having a refractive index smaller than that of said microlenses and being positioned directly on said microlenses so as to receive the incident light prior to the light being converged by said microlenses.

2. The solid image pickup device as claimed in claim 1, further comprising:
   a plurality of second spherical microlenses formed on said first transparent resin layer such that said microlenses are double-layered, the second microlenses forming an upper layer, the second microlenses being larger in shape than the first microlenses, the first microlenses forming a lower layer; and
   a second transparent resin layer formed to cover the upper layer of second microlenses.

3. The solid image pickup device as claimed in claim 1, further comprising:
   a molded-body for housing said microlenses, said transparent resin layer, and said substrate.

4. The solid image pickup device as claimed in claim 1, wherein said first microlenses are increased in optical density by adding a metal oxide to a base material of said first microlenses.

5. The solid image pickup device as claimed in claim 1, wherein said first microlenses are increased in optical density by introducing an aromatic ring into a base material of said first microlenses.

6. The solid image pickup device as claimed in claim 1, wherein said first microlenses are increased in optical density by introducing a halogenated alkyl group into a base material of said first microlenses.

7. The solid image pickup device as claimed in claim 1, wherein a base material of said first microlenses is selected from a group of polymide resin, polyether amide resin, polystyrene resin, acrylic resin, novolak resin, polyethylene, and ethyl methacrylate.

8. The solid image pickup device comprising:
   a substrate having light receiving portions;
   a plurality of spherical microlenses provided on said substrate having said light receiving portions, said plurality of spherical microlenses forming a single layer such that each light receiving portion of said substrate is positioned under one of said plurality of spherical microlenses, said microlenses being opposite said light receiving portions so that incident light can converge onto said light receiving portions; and
   a molded body made of a transparent resin formed directly on said microlenses and around said substrate;
   said microlenses have a refractive index larger than that of said molded body such that the incident light travels from said molded body having a first refractive index to said microlenses having larger refractive index than said first refractive index.

9. The solid image pickup device as claimed in claim 8, wherein said microlenses are increased in optical density by adding a metal oxide to a base material of said microlenses.

10. The solid image pickup device as claimed in claim 1, wherein said microlenses are increased in optical density by introducing an aromatic ring into a base material of said microlenses.

11. The solid image pickup device as claimed in claim 1, wherein said microlenses are increased in optical density by introducing a halogenated alkyl group into a base material of said microlenses.

12. The solid image pickup device as claimed in claim 8, wherein a base material of said microlenses is selected from a group of polymide resin, polyether amide resin, polystyrene resin, acrylic resin, novolak resin, polyethylene, and ethyl methacrylate.

13. A method for forming microlenses on a substrate provided with color filters which cover light receiving portions in a solid image pickup device, comprising the steps of:
   (a) forming a layer of a photosensitive resin which has permeability to light and a refractive index of 1.65 or more on a substrate which has a plurality of light receiving portions arrayed in one or more rows;
   (b) selectively photo-etching the photosensitive resin layer in a square or stripe pattern to leave the photosensitive resin layer in a sectionally rectangular shape on the substrate in positions corresponding to respective ones of the light receiving portions or positions corresponding to respective rows of the light receiving portions;
   (c) applying a heat treatment to the substrate provided with the photosensitive resin layer at a temperature not affecting properties of the color filters; and
   (d) irradiating the photosensitive resin layer with ultraviolet light during execution of said step (c) so that photo active groups contained int eh photosensitive resin decompose, the photosensitive resin being softened at said step (c) so as to be semispherically or semi-cylindrically shaped by surface tension of the photosensitive resin;
   said step (c) heating the photosensitive resin layer at a temperature below 160° C.

14. The method as claimed in claim 13, wherein said step (d) irradiates near ultraviolet light onto the photosensitive resin layer.

* * * * *